(12) United States Patent
Federizo et al.

(10) Patent No.: US 10,349,537 B1
(45) Date of Patent: Jul. 9, 2019

(54) ELECTRICAL UNIT

(71) Applicant: Lear Corporation, Southfield, MI (US)

(72) Inventors: Victor Federizo, Shanghai (CN); Shaun Cesar, Baden-Wuerttemberg (DE); Marcial Quintanilla, Lapu-Lapu (PH); Joseph N. Narca, Lapu-Lapu (PH); Qin Saifeng, Shanghai (CN)

(73) Assignee: Lear Corporation, Southfield, MI (US)

( * ) Notice: Subject to any disclaimer, the term of this patent is extended or adjusted under 35 U.S.C. 154(b) by 35 days.

(21) Appl. No.: 15/955,207

(22) Filed: Apr. 17, 2018

(51) Int. Cl.

| | |
|---|---|
| *H05K 1/14* | (2006.01) |
| *H05K 5/00* | (2006.01) |
| *B60R 16/02* | (2006.01) |
| *B60R 16/03* | (2006.01) |
| *B60R 16/023* | (2006.01) |
| *H05K 1/18* | (2006.01) |
| *H05K 3/34* | (2006.01) |
| *H01R 12/71* | (2011.01) |

(52) U.S. Cl.
CPC ....... *H05K 5/0047* (2013.01); *B60R 16/0207* (2013.01); *B60R 16/0238* (2013.01); *B60R 16/03* (2013.01); *H05K 1/144* (2013.01); *H05K 1/181* (2013.01); *H05K 3/341* (2013.01); *H05K 5/0017* (2013.01); *H01R 12/716* (2013.01); *H05K 2201/042* (2013.01); *H05K 2201/10189* (2013.01)

(58) Field of Classification Search
CPC ...... H05K 5/0047; H05K 1/181; H05K 1/144; H05K 5/0017; H05K 3/341; H05K 2201/042; H05K 2201/10189; B60R 16/0238; B60R 16/03; B60R 16/0207; H01R 12/716
See application file for complete search history.

(56) References Cited

U.S. PATENT DOCUMENTS

| | | | |
|---|---|---|---|
| 4,216,523 A | 8/1980 | Harford | |
| 4,401,351 A | 8/1983 | Record | |
| 5,181,855 A | 1/1993 | Mosquera et al. | |
| 5,519,573 A | 5/1996 | Cobb et al. | |
| 5,575,686 A | 11/1996 | Noschese | |
| 6,350,949 B1 * | 2/2002 | Boyd | B60R 16/0238 174/17.05 |
| 6,731,515 B2 | 5/2004 | Rhoads | |
| 6,870,096 B2 * | 3/2005 | Suzuki | B60R 16/0239 174/50 |
| 7,419,386 B2 * | 9/2008 | Washihira | B60R 16/0239 361/775 |

(Continued)

*Primary Examiner* — Abhishek M Rathod
(74) *Attorney, Agent, or Firm* — Fishman Stewart PLLC

(57) ABSTRACT

An electrical unit includes a housing member, a cover configured to at least partially cover the housing member, a primary circuit board disposed in the housing, and one or more secondary circuit boards connected to the primary circuit board. A primary circuit board may include a plurality of connection sections. A secondary circuit board may be connected to a respective pair of connection sections of the plurality of connection sections, such as via a respective pair of interconnection headers. A secondary circuit board may include a connector that may extend into a corresponding connector portion of the cover. Each of the one or more secondary circuit boards may include at least one of circuitry and electrical components for a respective vehicle function of a plurality of vehicle functions.

20 Claims, 14 Drawing Sheets

(56) References Cited

U.S. PATENT DOCUMENTS

| | | | |
|---|---|---|---|
| 2003/0162421 A1* | 8/2003 | Pratt | H01R 13/6658 439/76.1 |
| 2006/0141824 A1* | 6/2006 | Kubota | B60R 16/0238 439/76.2 |
| 2009/0020332 A1* | 1/2009 | Sano | H05K 3/368 174/88 R |
| 2009/0258543 A1* | 10/2009 | Keyser | H05K 5/0069 439/660 |
| 2010/0101857 A1* | 4/2010 | Miyamoto | H01R 9/2466 174/559 |
| 2010/0231038 A1* | 9/2010 | Sugimura | B60R 16/0238 307/9.1 |
| 2012/0199373 A1* | 8/2012 | Uchida | B60R 16/0238 174/50 |
| 2013/0095673 A1* | 4/2013 | Brandon | H01R 12/58 439/55 |
| 2013/0208432 A1* | 8/2013 | Bang | B60R 16/0238 361/752 |
| 2014/0365698 A1 | 12/2014 | Richard et al. | |
| 2015/0064974 A1* | 3/2015 | Ozaki | H01R 12/712 439/626 |

* cited by examiner

ELECTRICAL UNIT

TECHNICAL FIELD

The present disclosure generally relates to electrical units, including electrical units that may be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

With some electrical units, any change in functionality may require significant modification, approvals, and/or verification.

There is a desire for solutions/options that minimize or eliminate one or more challenges or shortcomings of electrical units. The foregoing discussion is intended only to illustrate examples of the present field and should not be taken as a disavowal of scope.

SUMMARY

In embodiments, an electrical unit may include a housing member, a cover configured to at least partially cover the housing member, a primary circuit board disposed in the housing, and/or one or more secondary circuit boards connected to the primary circuit board. A primary circuit board may include a plurality of connection sections. A secondary circuit board may be connected to a respective connection section (or pair of connection sections) of the plurality of connection sections, such as via a respective interconnection header (or pair of connection headers). A secondary circuit board may include a connector that may extend into a corresponding connector portion of the cover. Each of the one or more secondary circuit boards may include electrical components for a respective vehicle function of a plurality of vehicle functions. Vehicle functions may include heated seats, pulse width modulation (PWM) controlled lighting, windshield wipers, passive entry, passive start, power windows, and/or door locking, among others. Each of the one or more secondary circuit boards may be configured to communicate with a primary controller of the primary circuit board, such as via a serial peripheral interface bus. At least one secondary circuit board of the one or more secondary circuit boards may be connected to two pairs of connection sections of the plurality of connection sections. The cover may include a connector portion for each pair of connection sections.

With embodiments, an electrical unit may include an electrical component connected to an underside of a secondary circuit board of the one or more secondary circuit boards such that the electrical component is disposed substantially between the secondary circuit board and the primary circuit board. Each secondary circuit board of the one or more secondary circuit boards may be configured for a direct connection with a vehicle wiring harness. Each secondary circuit board of the one or more secondary circuit boards may be connected to a first power bus, a second power bus, a communication bus, and/or a ground bus. An electrical unit may include primary controller connected to the primary circuit board and a respective secondary controller connected to each secondary circuit board of the one or more secondary circuit boards. A primary controller may be configured to control, at least in part, operation of some or all of the secondary controller(s). A primary circuit board may include at least four pairs of connection sections. An electrical unit may include at least two secondary circuit boards of different configurations.

In embodiments, a housing member may include a support column for each secondary circuit board. A support column may extend through the primary circuit board to support an underside of a respective secondary circuit board. Each support column may be aligned with an electrical connector (e.g., a wiring harness connector) of the respective secondary circuit board. Each secondary circuit board may be disposed substantially at a common height relative to the primary circuit board. Each secondary circuit board of the one or more secondary circuit boards may be soldered to a respective pair of interconnection headers, and the respective pair of interconnection headers may be soldered to the primary circuit board. At least one interconnection header may include at least ten electrical terminals. A cover may include a plurality of connector portions configured for connection with wiring harness connectors. An electrical unit may include at least two secondary circuit boards having a common configuration.

With embodiments, an electrical unit may include a housing member, a cover configured to at least partially cover the housing member, and/or a primary circuit board disposed in the housing and including a plurality of connection sections. A plurality of connection sections may be configured to connect one or more secondary circuit boards to the primary circuit board.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
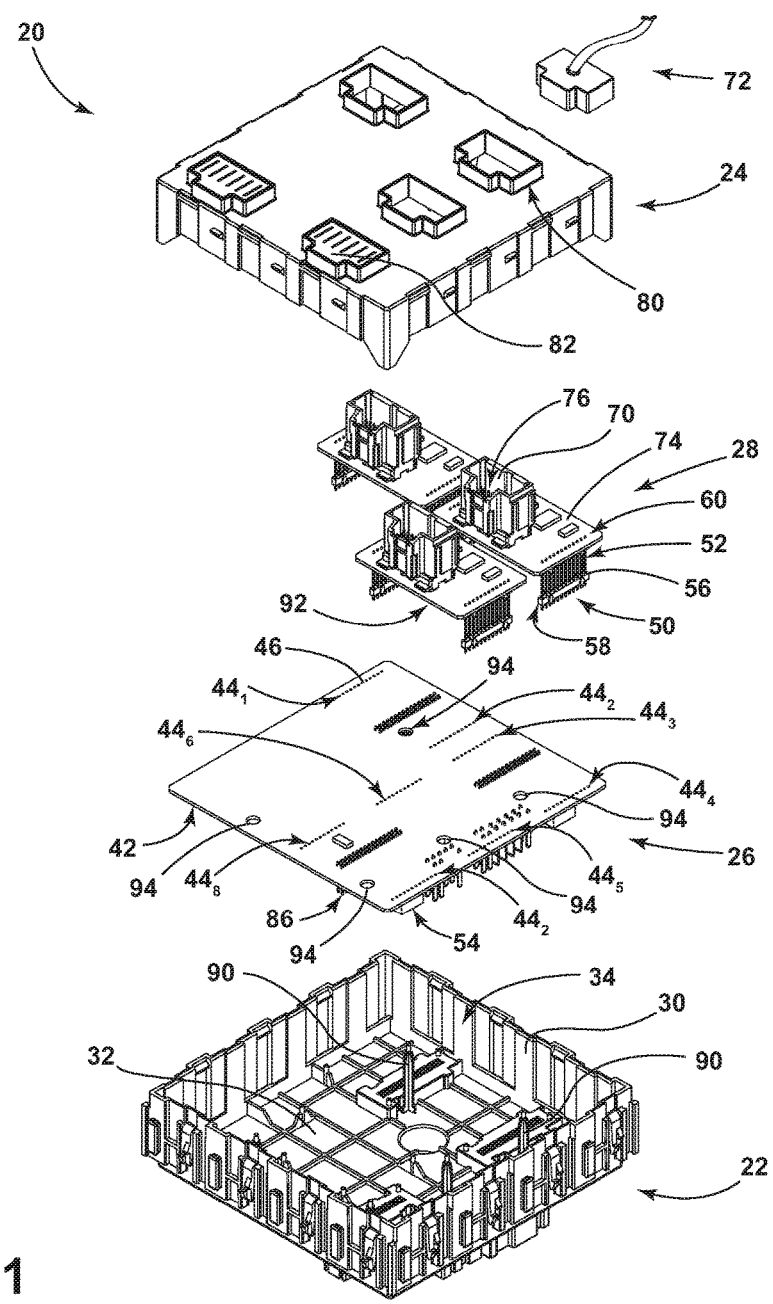
FIG. 1 is an exploded perspective view generally illustrating an embodiment of an electrical unit according to teachings of the present disclosure.
Figure 2:
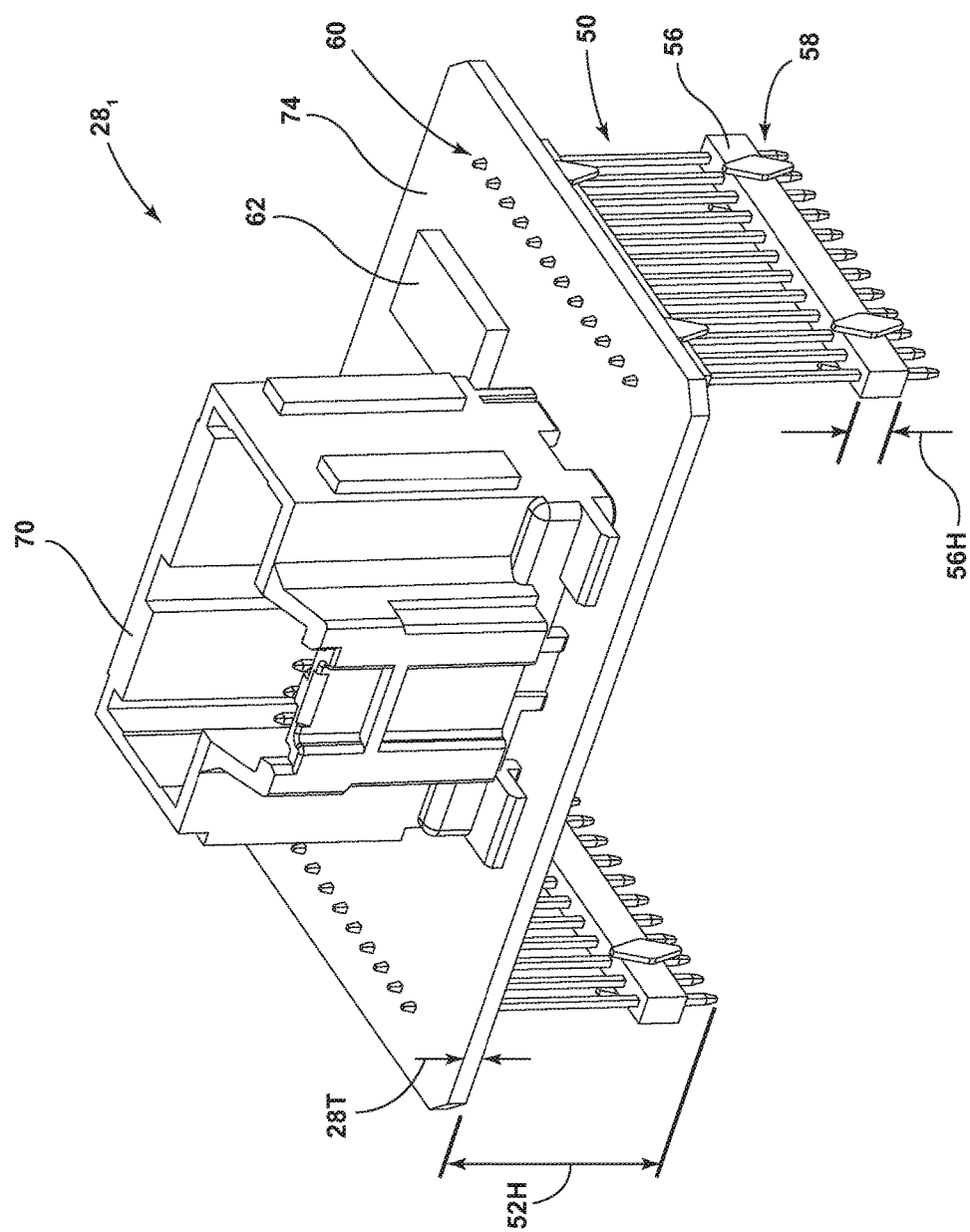
FIG. 2 is a perspective view generally illustrating top portions of an embodiment of a secondary circuit board having a first configuration according to teachings of the present disclosure.
Figure 2A:
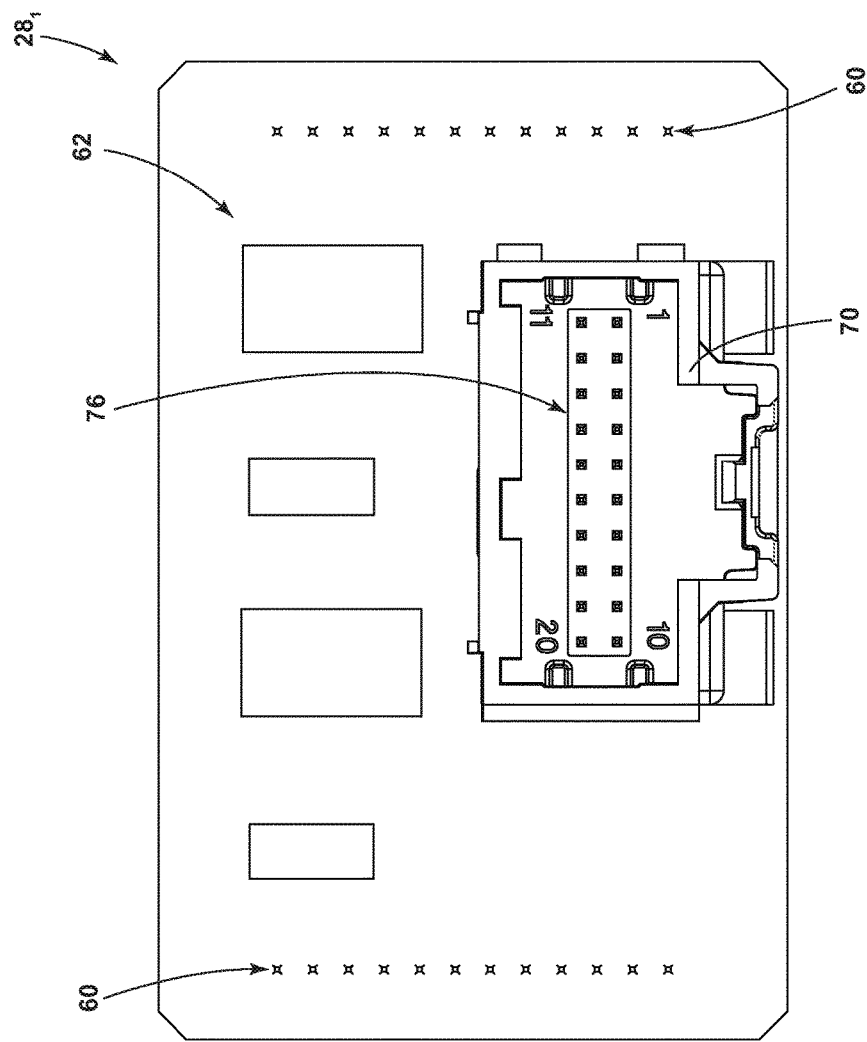
FIG. 2A is a top view generally illustrating portions of an embodiment of a secondary circuit board having the first configuration according to teachings of the present disclosure.
Figure 3:
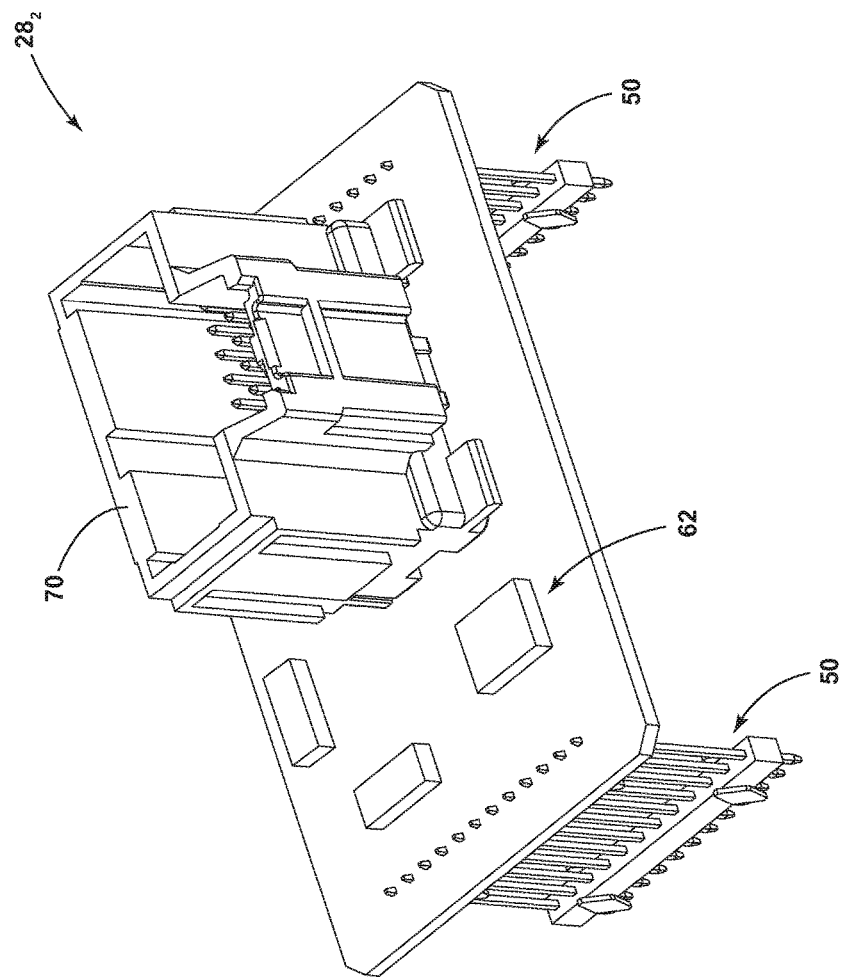
FIG. 3 is a perspective view generally illustrating top portions of an embodiment of a secondary circuit board having a second configuration according to teachings of the present disclosure.
Figure 4:
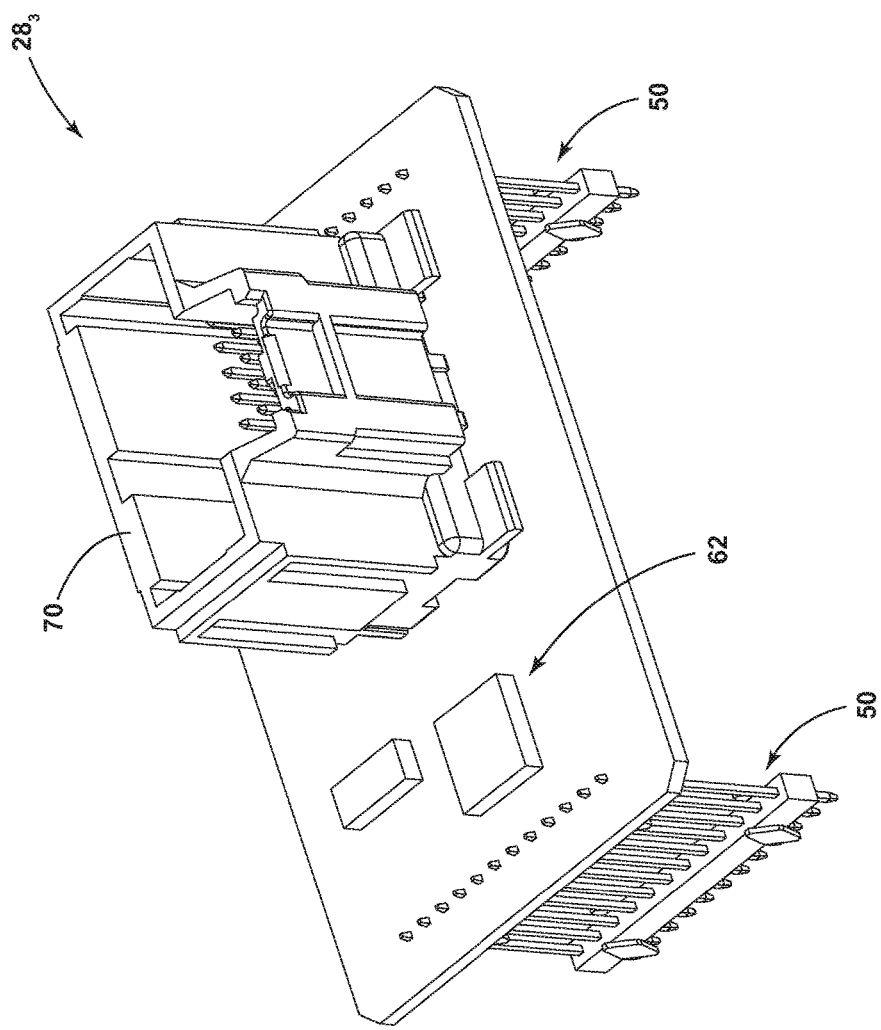
FIG. 4 is a perspective view generally illustrating top portions of an embodiment of a secondary circuit board having a third configuration according to teachings of the present disclosure.
Figure 5:
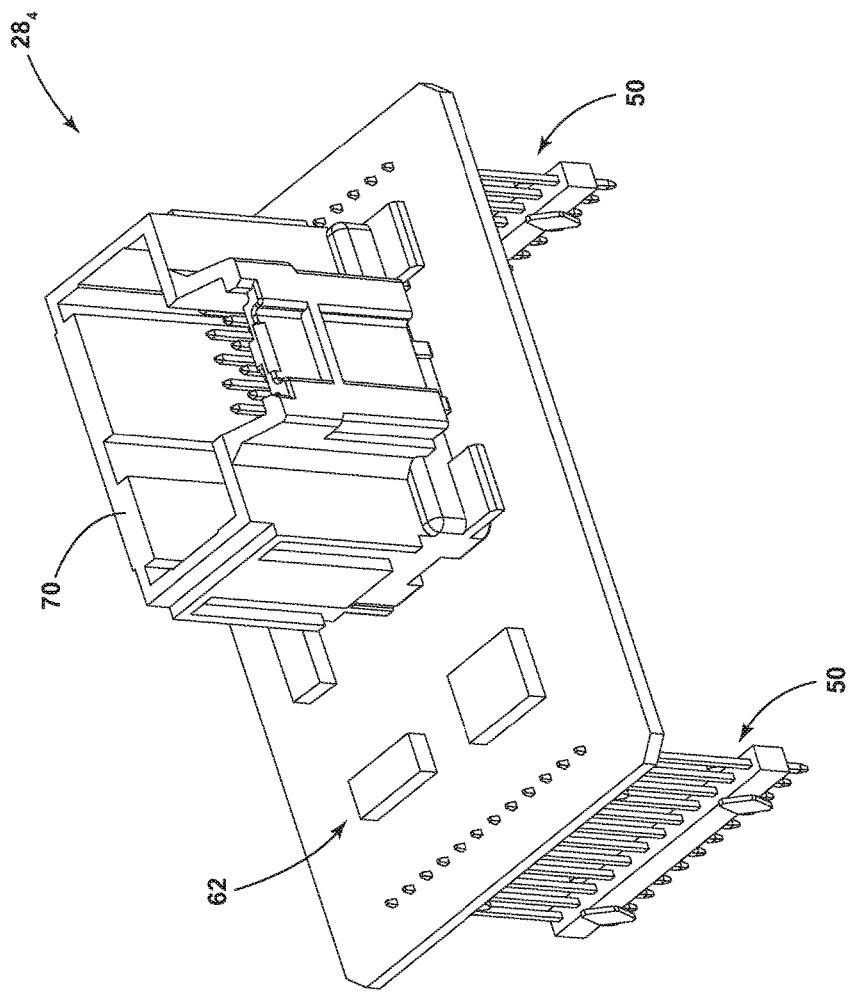
FIG. 5 is a perspective view generally illustrating top portions of an embodiment of a secondary circuit board having a fourth configuration according to teachings of the present disclosure.
Figure 6:
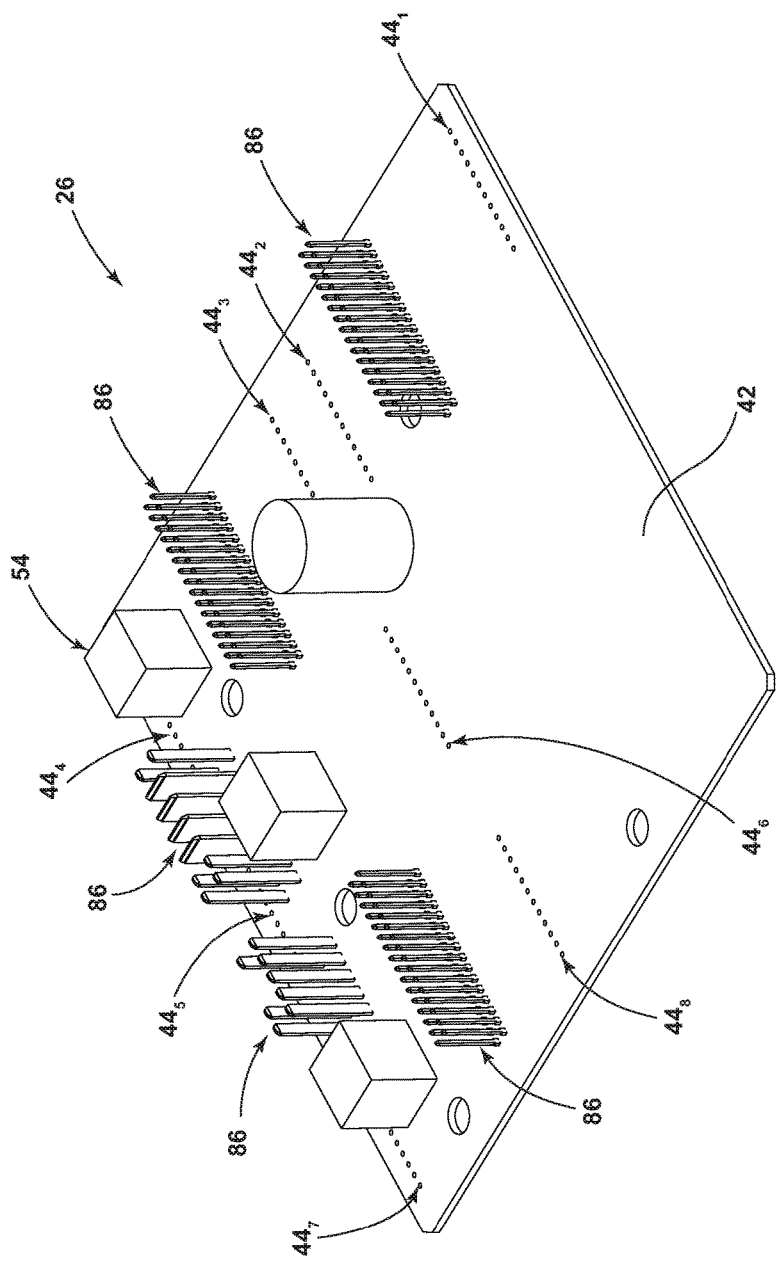
FIG. 6 is a perspective view generally illustrating portions of an underside of an embodiment of a primary circuit board according to teachings of the present disclosure.

In embodiments, such as generally illustrated in FIGS. 1, 2, and 2A, an electrical unit 20 may include a housing member 22, a cover 24, a primary circuit board 26, and/or one or more secondary circuit boards 28. An electrical unit 20 may, for example and without limitation, be utilized in connection with controlling one or more components and/or functions of a vehicle, such as a passenger vehicle.

With embodiments, a housing member 22 may be configured to at least partially receive and/or cover a primary circuit board 26. A housing member 22 may include one or more of a variety of shapes, sizes, configurations, and/or materials. For example and without limitation, a housing member 22 may include a generally rectangular configuration that may include a plurality of side walls 30 and a base wall 32. Side walls 30 may extend substantially perpendicular from base wall 32 and may define or provide a cavity 34. A primary circuit board 26 may be disposed at least partially in cavity 34.

In embodiments, a primary circuit board 26 may include a primary controller 40 that may be connected to a first side 42 (e.g., an underside) of primary circuit board 26. Primary circuit board 26 may include one or more connection sections 44 that may be configured for connecting secondary circuit boards 28 with primary circuit board 26. For example and without limitation, primary circuit board 26 may include at least a pair of connection sections 44 for each secondary circuit board 28 that may be connected to primary circuit board 26. A connection section 44 may include one or more of a variety of shapes, sizes, configurations, and/or materials. For example and without limitation, a connection section 44 may include one or more pin or terminal connection features 46, which may include apertures that may be configured to receive electrical terminals or pins 52 of an interconnection header 50. An interconnection header 50 may connect a secondary circuit board 28 with primary circuit board 26. Additionally or alternatively, pin or terminal connection features 46 may include solder portions or pads that may be configured for connection with electrical terminals or pins 52 of an interconnection header 50. A connection section 44 may include a generally rectangular and/or linear configuration that may be disposed substantially in parallel with an edge or side (e.g., a short edge) of primary circuit board 26. In embodiments, some or all of connection sections 44 may be disposed in parallel with each other.

With embodiments, a primary circuit board 26 may include a plurality of connection sections 44, such as, for example and without limitation, ten connection sections 44. In an embodiment, a first pair of connection sections $44_1$, $44_2$ may be configured for connection with a first secondary circuit board $28_1$, a second pair of connection sections $44_3$, $44_4$ may be configured for connection with a second secondary circuit board $28_2$, a third pair of connection sections $44_5$, $44_6$ may be configured for connection with a third secondary circuit board $28_3$, a fourth pair of connection sections $44_7$, $44_8$ may be configured for connection with a fourth secondary circuit board $28_4$, and/or a fifth pair of connection sections $44_9$, $44_{10}$ may be configured for connection with a fifth secondary circuit board 28 (see, e.g., FIG. 7). Connection sections 44 may be disposed in a plurality of rows and/or columns that may each include one or more connection sections 44. Of course, connection sections 44 may be provided in other patterns than those illustrated.

In embodiments, such as generally illustrated in FIGS. 1, 2, 2A, 3, 4, 5, 7 and 8, an electrical unit 20 may include one or more interconnection headers 50 that may be configured for physically and/or electrically connecting secondary circuit boards 28 with primary circuit board 26. An interconnection header 50 may include one or more of a variety of shapes, sizes, configurations, and/or materials. In embodiments, an interconnection header 50 may include a body 56 and one or more electrical terminals or pins 52. Body 56 may include an electrically insulating material and may be configured to support electrical terminals or pins 52. For example and without limitation, body 56 may support a plurality of electrical terminals or pins 52 in a substantially linear configuration. An interconnection header 50 may be connected to a connection section 44 of primary circuit board 26. For example and without limitation, first ends 58 of electrical terminals or pins 52 may be inserted into primary circuit board 26 and/or may be fixed (e.g., soldered) to primary circuit board 26. Additionally or alternatively, an interconnection header 50 may be connected to a secondary circuit board 28. For example and without limitation, second ends 60 of electrical terminals or pins 52 may be inserted into and/or soldered to a secondary circuit board 28. Body 56 may be disposed between first ends 58 and second ends 60 of electrical terminals 52. Body 56 may be disposed closer to first ends 58 than second ends 60 and/or body 56 may be disposed at least partially in contact with primary circuit board 26. A height 56H of body 56 may be less than a height 52H of electrical terminals 52. For example and without limitation, a height 56H of body 56 may be one-third or less of a height 52H of electrical terminals 52. Electrical terminals 52 may include heights 52H that may be greater than a thickness 26T of primary circuit board 26 and/or thicknesses 28T of secondary circuit boards 28. For example and without limitation, a height 52H of electrical terminals 52 may be ten or more times greater than a thickness 26T of primary circuit board 26 and/or thicknesses 28T of secondary circuit boards 28. Thicknesses 28T may or may not be the same for each secondary circuit board 28. A height of secondary circuit boards 28 relative to primary circuit board 26 may or may not be substantially the same or common.

With embodiments, an interconnection header 50 may extend substantially perpendicular to primary circuit board 26 and/or to a secondary circuit board 28. With embodiments, one or more interconnection headers 50 may be connected to a secondary circuit board 28. For example and without limitation, two interconnection headers 50 may connect a secondary circuit board 28 to primary circuit board 26. In embodiments, interconnection headers 50 may be configured to rigidly fix secondary circuit boards 28 to primary circuit board 26. In embodiments, a secondary circuit board 28 may be supported and/or connected to primary circuit board 26 via more than two interconnection headers 50, such as via four (e.g., two pairs of) interconnection headers 50 (see, e.g., secondary circuit board $28_5$ generally illustrated in FIG. 8).

With embodiments, such as generally illustrated in FIGS. 1, 2, 2A, 3, 4, 5, 6, 7, and 8, an electrical unit 20 may include one or more secondary circuit boards 28. A secondary circuit board 28 may include one or more of a variety of shapes, sizes, configurations, and/or materials. In embodiments, each secondary circuit board 28 may include electrical components 62 configured for providing and/or controlling one or more respective systems. Electrical components 62 may include one or more of a wide variety of components, such as, for example and without limitation, relays, fuses, circuits, and/or controllers, among others. Electrical components 62 connected to a secondary circuit board 28 may include a secondary controller that may be controlled, at least in part, via primary controller 40. Such one or more respective systems that may be controller via a secondary circuit board 28 may include a wide range of systems, such as vehicle systems or functions. For example and without limitation, systems may include one or more of heated seats, PWM-controlled lighting, windshield wipers (e.g., rain sensing windshields/wipers), passive entry systems, passive start systems, power windows (e.g., automatic windows with anti-pinch functionality), and/or door locking (e.g., individual door locking), among others. With embodiments, secondary circuit boards 28 may be modular and/or may provide an electrical unit 20 with a modular configuration. For example, an electrical unit 20 may be configured to be utilized in a variety of applications without significant modification for housing member 22, cover 24, and/or primary circuit board 26. Instead, particular sets or combinations of secondary circuit boards 28, which may include zero to several or many secondary circuit boards, may be utilized for each application. In embodiments, secondary circuit boards may include a first configuration, a second configuration, a third configuration, a fourth configuration, and/or a fifth configuration, such as generally illustrated in connection with secondary circuit boards $28_1$, $28_2$, $28_3$, $28_4$, $28_5$ in FIGS. 2, 3, 4, 5, and 8, respectively. An electrical unit 20 may include a wide variety of combinations of configurations of secondary circuit boards 28. For example and without limitation, an electrical unit 20 may include secondary circuit boards 28 of each configuration, multiple of some configurations, only some configurations (e.g., zero of some configurations), and/or only a single configuration.

In embodiments, such as generally illustrated in FIGS. 1-9A, a secondary circuit board 28 may include an electrical connector or connector header 70 that may be configured for connection with and/or be may configured to at least partially receive a corresponding connector 72, such as a connector of vehicle wiring harness. An electrical connector 70 may extend substantially perpendicular from a secondary circuit board 28 and/or may extend away from primary circuit board 26. An electrical connector 70 may extend from a top side 74 of a secondary circuit board 28. An electrical connector 70 may, for example and without limitation, include twenty pins or terminals 76.

Figure 9A:
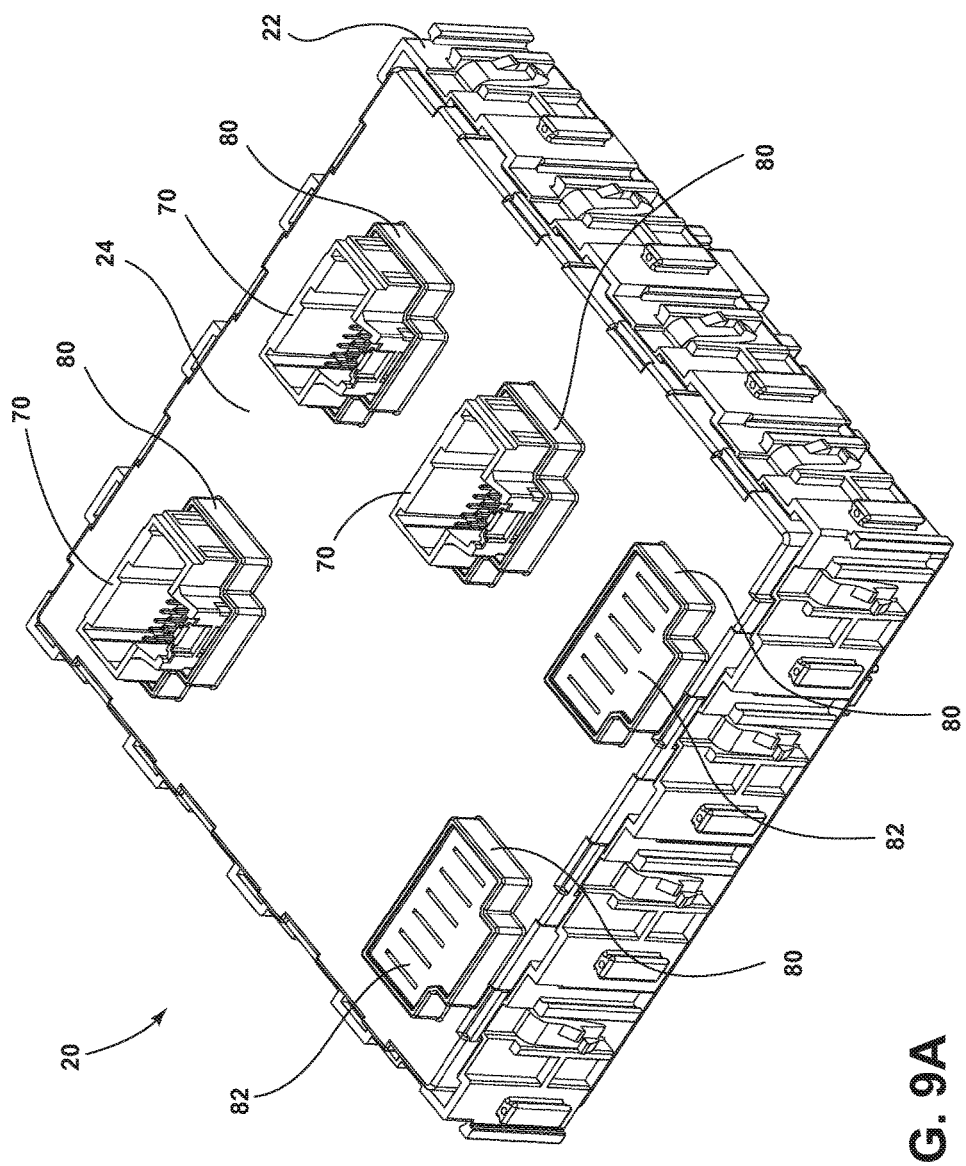
FIG. 9A is a perspective view generally illustrating top portions of an embodiment of an electrical unit according to teachings of the present disclosure.

With embodiments, such as generally illustrated in FIG. 9A, an electrical unit 20 may include a cover 24 that may be configured to cover at least some portions of housing member 22, primary circuit board 26, and/or one or more secondary circuit boards 28. A cover 24 may include one or more of a variety of shapes, sizes, configurations, and/or materials. A cover 24 may include one or more connector portions 80, such as recesses, apertures, and/or shrouds, which may be configured to at least partially receive and/or provide access to electrical connectors 70 of secondary circuit boards 28. For example and without limitation, a cover 24 may include a connector portion 80 for each pair of connection sections 44 of a primary circuit board 26 and/or for each secondary circuit board 28.

In embodiments, a cover 24 may include one or more connector portions 80 for a maximum number of secondary circuit boards 28 (e.g., for each pair of connection sections 44), even if the maximum number of secondary circuit boards 28 are not connected to primary circuit board 26. Connector portions 80 may each include a wall 82 (e.g., a top wall) that may be removed if an electrical connector 70 of a secondary circuit board 28 is aligned with a connector portion 80 and may not be removed if an electrical connector 70 of a secondary circuit board 28 is not aligned with the connector potion 80 (e.g., if the secondary circuit board 28 does not include an electrical connector 70 or if a secondary circuit board 28 is not connected to a corresponding pair of connection sections 44 of primary circuit board 26). Such a configuration may allow a single configuration of cover 24 to be used for a wide variety of applications, such as applications in which zero secondary circuit boards 28 are connected to primary circuit board 26, in which one or more secondary circuit boards 28 are connected to primary circuit board 26, and/or in which a maximum number of secondary circuit boards 28 are connected to primary circuit board 26. Walls 82 may be integrally formed with cover 24 and/or may be separately connected or attached to cover 24. With embodiments, connector portions 80 may be configured to receive electrical connectors 70 such that electrical connectors 70 extend into, through, and/or at least partially beyond/outside of cover 24.

Figure 9B:
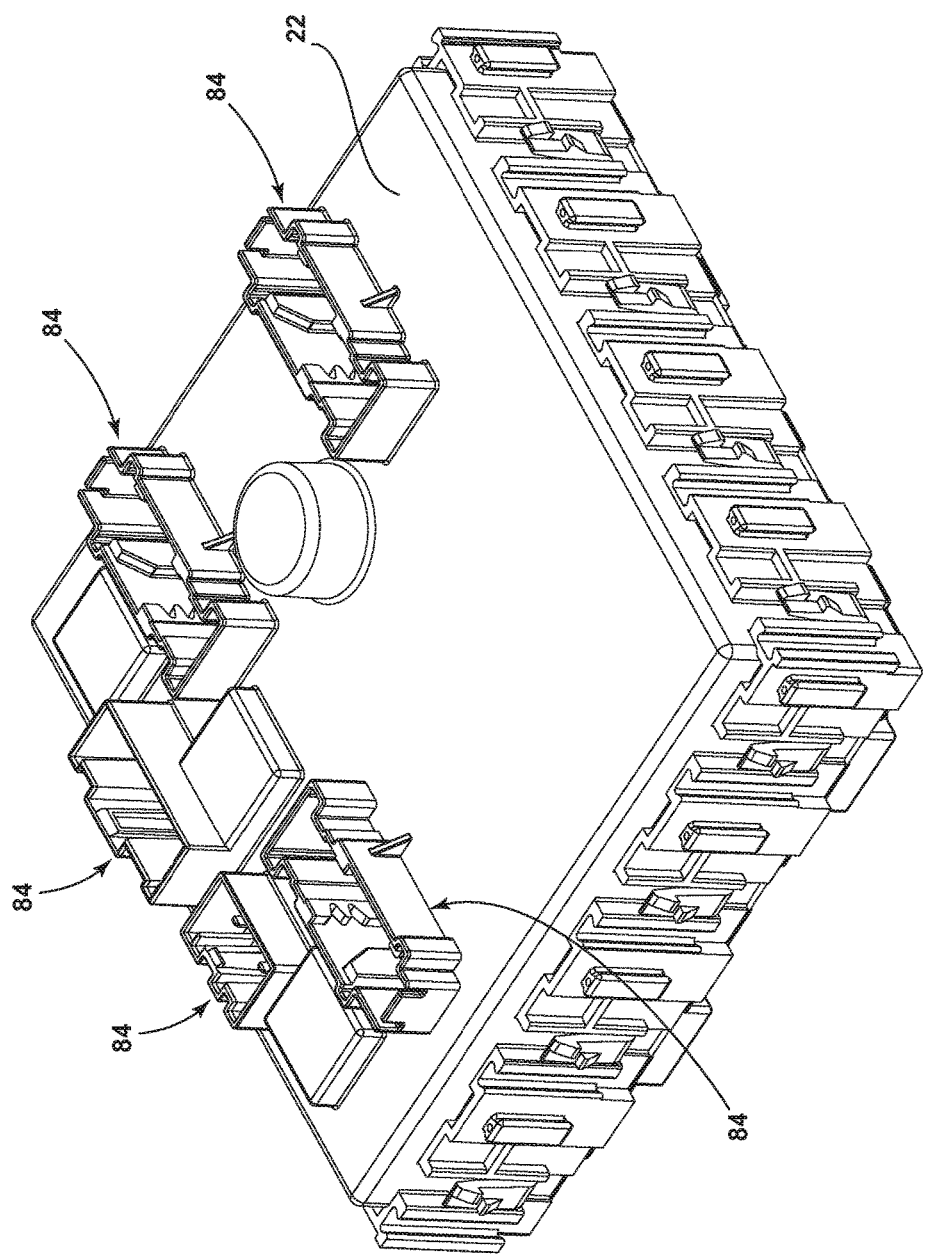
FIG. 9B is a perspective view generally illustrating bottom portions of an embodiment of an electrical unit according to teachings of the present disclosure.
Figure 10:
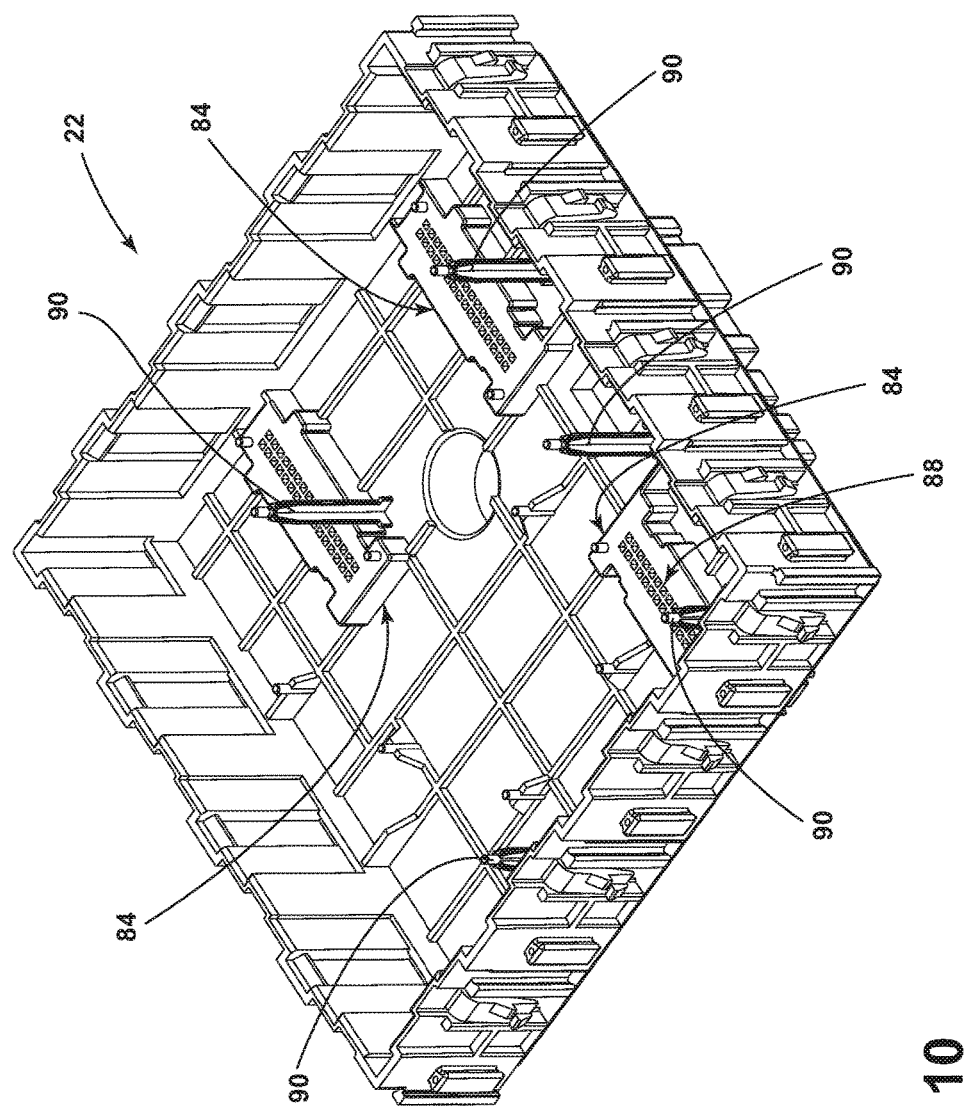
FIG. 10 is a perspective view generally illustrating top portions of an embodiment of a housing member according to teachings of the present disclosure.
Figure 11:
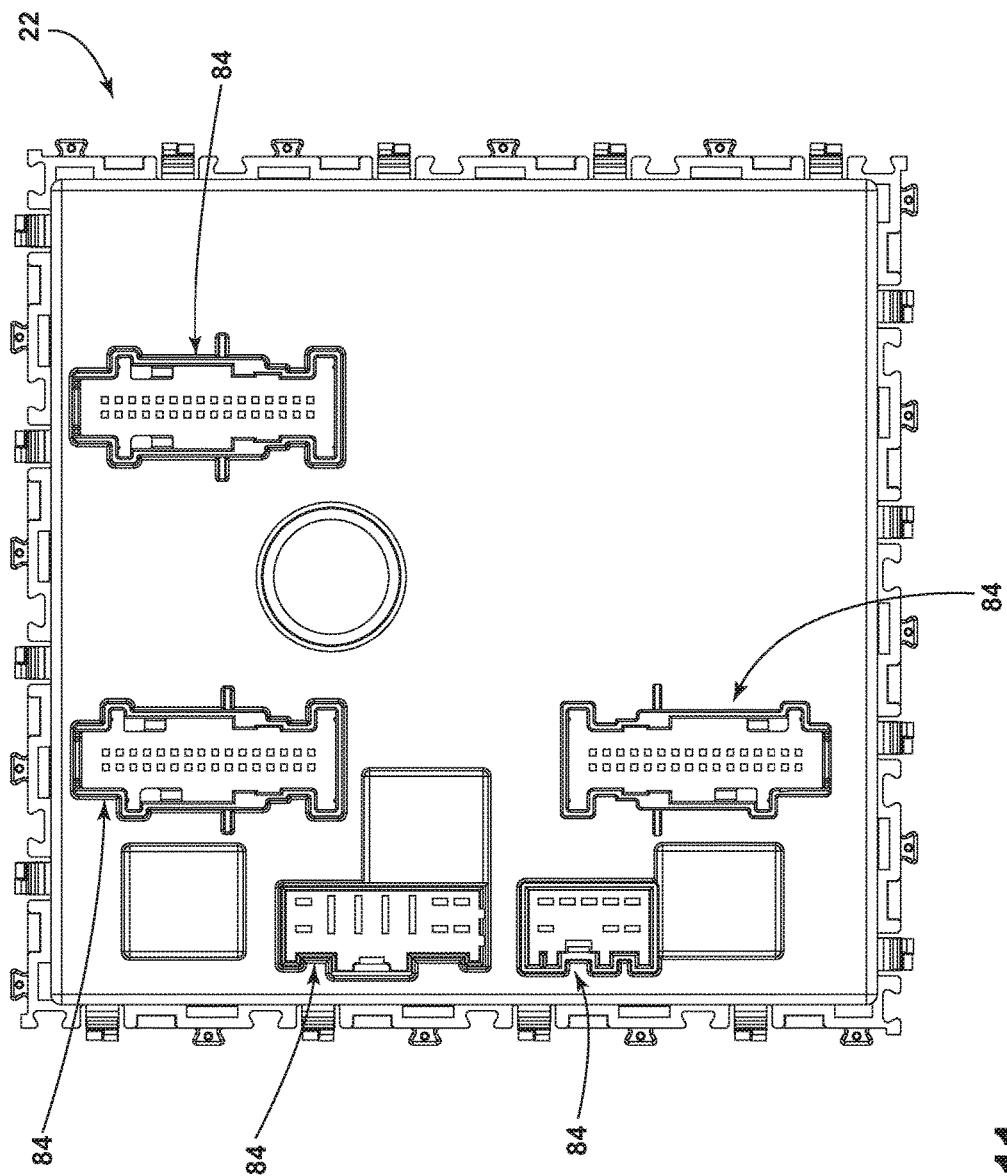
FIG. 11 is a bottom view generally illustrating portions of an embodiment of a housing member according to teachings of the present disclosure.
Figure 12:
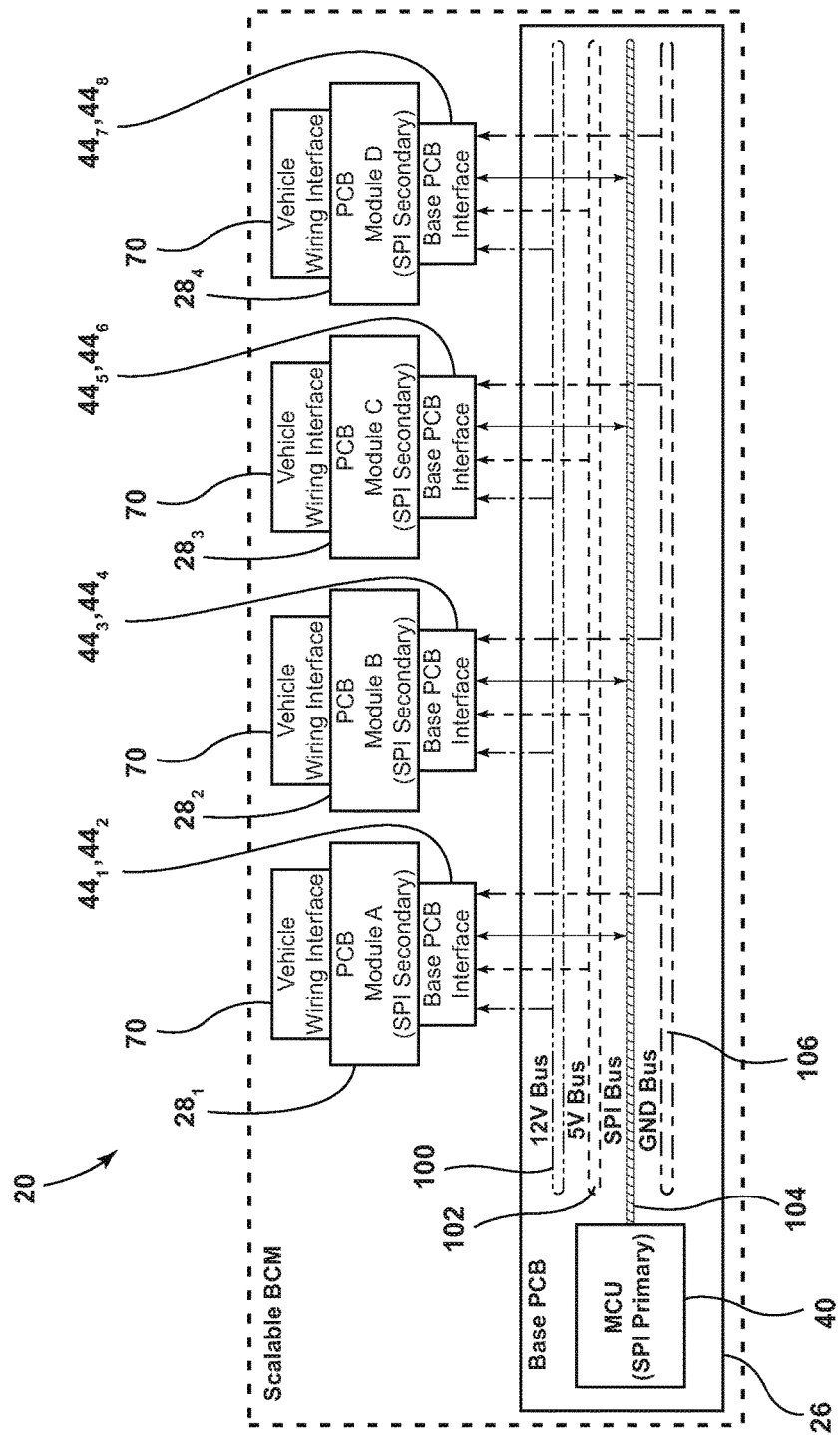
FIG. 12 is a schematic view generally illustrating an embodiment of a primary circuit board and embodiments of secondary circuit boards according to teachings of the present disclosure.

In embodiments, such as generally illustrated in FIGS. 9B, 10, and 11, a housing member 22 may include one or more connector portions 84, which may include apertures, recesses, and/or connector shrouds. Connector portions 84 may be included with and/or extend from base wall 32. Connector portions 84 may be configured to at least partially receive an external electrical connector 72 (e.g., from a wiring harness). With embodiments, electrical terminals 86 of primary circuit board 26 may extend into connector portions 84 and/or through connector portions 84 such that electrical terminals 86 extend outside of cavity 34 for connection with corresponding terminals of an external electrical connector 72. Connector portions 84 of housing member 22 may include apertures 88 through which electrical terminals 86 may extend. For example and without limitation, one or more connector portions 84 may include an aperture 88 for each electrical terminal 86.

With embodiments, such as generally illustrated in FIG. 10, a housing member 22 may include one or more support columns 90. A support column 90 may be configured to provide mechanical and/or structural support for a secondary circuit board 28. A support column 90 may extend from housing member 22, toward a secondary circuit board 28, almost to a secondary circuit board 28, and/or may extend from housing member 22 to a secondary circuit board 28 such that the support column 90 is in contact with secondary circuit board 28 (e.g., in contact with an underside 92 of a secondary circuit board 28). A support column 90 may be disposed such that the support column 90 is at least partially aligned with an electrical connector 70 of a secondary circuit board 28. For example and without limitation, a support column 90 may be disposed to support a secondary circuit board 28 at or near an electrical connector 70 such that during connection of a corresponding connector 72 with the electrical connector 70, movement of and/or forces applied to the secondary circuit board 28 may be restricted by the support column 90. In embodiments, a support column 90 may extend from housing member 22, such as from base wall 32, and through a respective aperture 94 in primary circuit board 26 toward a secondary circuit board 28. A housing member 22 may include a support column 90 for each secondary circuit board 28 and/or for each electrical connector 70. Support columns 90 may include one or more of a variety of shapes and sizes, and may or may not be cylindrical.

In embodiments, a housing member 22 may be formed and/or provided as a single, unitary, and/or monolithic component. For example and without limitation, base wall 32, side walls 30, connector portions 84, and/or support columns 90 may be integrally formed as a monolithic housing member 22.

Figure 7:
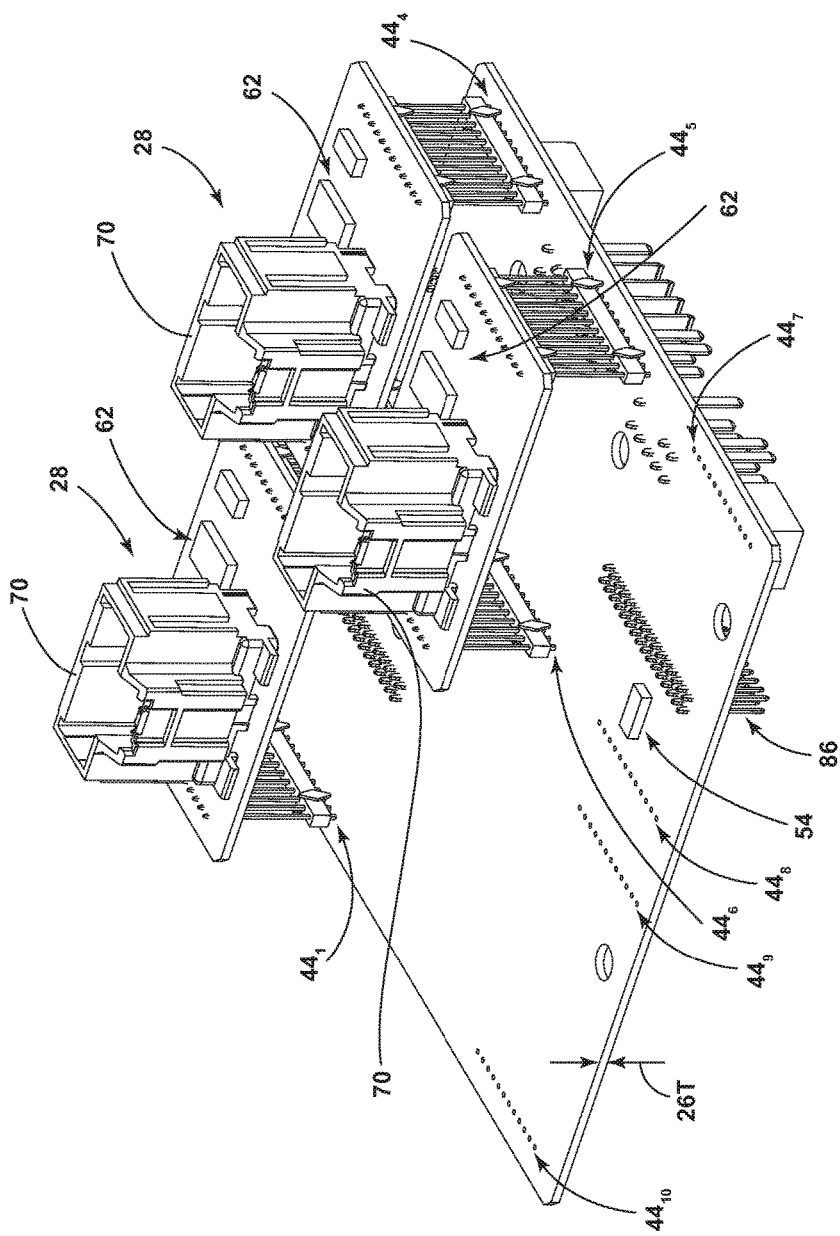
FIG. 7 is a perspective view generally illustrating top portions of an embodiment of a primary circuit board and embodiments of secondary circuit boards according to teachings of the present disclosure.
Figure 8:
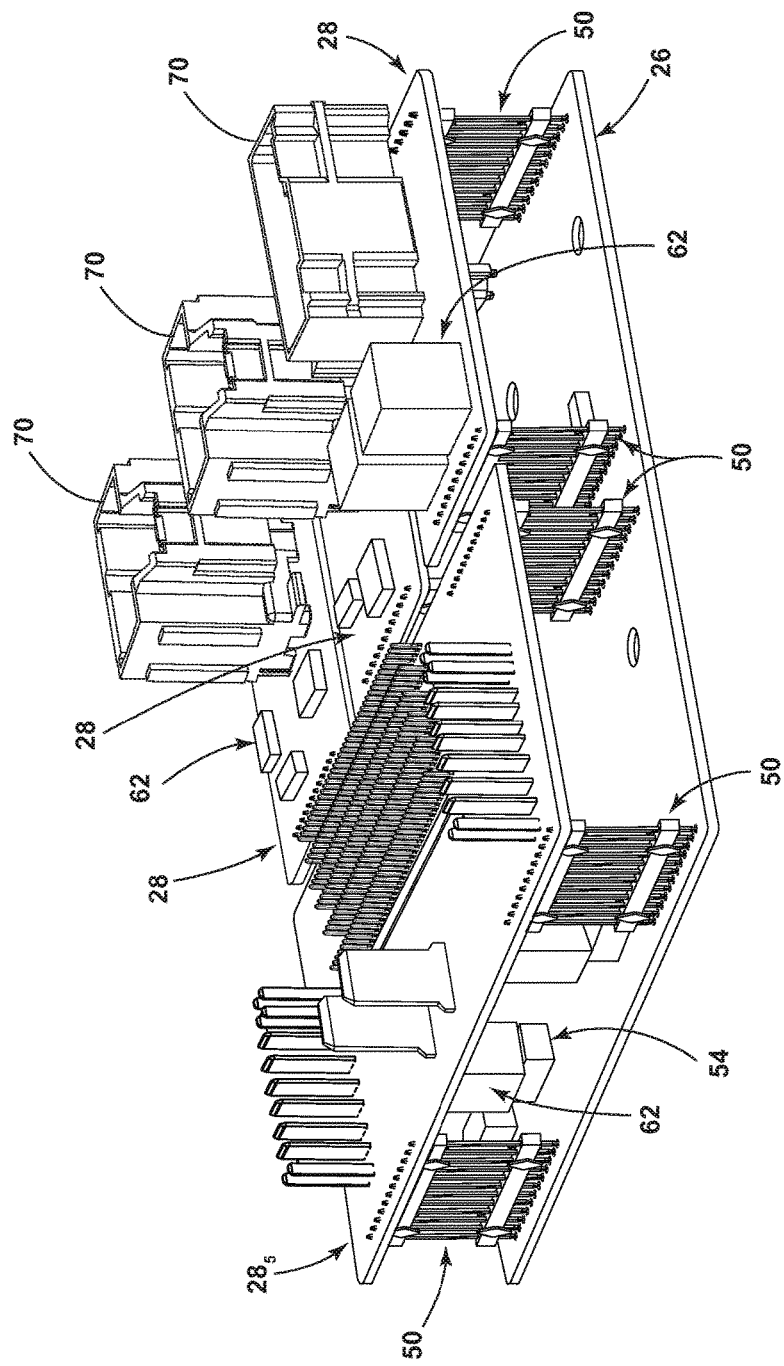
FIG. 8 is a perspective view generally illustrating top portions of an embodiment of a primary circuit board and embodiments of secondary circuit boards according to teachings of the present disclosure.

In embodiments, such as generally illustrated in FIGS. 1, 7, and 8, one or more electrical components 54, 62 may be connected to both sides of primary circuit board 26 and/or both sides of some or all secondary circuit boards 28. For example and without limitation, one or more electrical components 62 may be connected to an underside of a secondary circuit board 28 such that the one or more electrical components 62 are disposed at least partially between primary circuit board 26 and the secondary circuit board(s) 28. Additionally or alternatively, electrical components 54 may be connected to primary circuit board 26 and disposed at least partially between primary circuit board 26 and a secondary circuit board 28 and/or electrical components 62 extending from the underside 92 of secondary circuit board 28. With embodiments, primary circuit board 26 and secondary circuit board(s) 28 may be disposed substantially in parallel with each other.

In embodiments, such as generally illustrated in FIGS. 1 and 9A-11, a housing member 22 (e.g., side walls 30) may be configured for connection with one or more other components, such as other housing members and/or support modules. Examples of support modules and connections between components are generally described in U.S. Pat. No. 9,124,081, the disclosure of which is hereby incorporated by reference in its entirety as though fully set forth herein.

With embodiments, a primary circuit board 26 may be in communication with one or more secondary circuit boards 28. For example and without limitation, primary circuit board 26 and secondary circuit board(s) 28 may be connected, electrically and/or physically, to one or more common buses, such as a first power bus 100, a second power bus 102, a communication bus 104, and/or a ground bus 106. First power bus 100 and/or second power bus 102 may be configured to provide electrical power to electrical components (e.g., electrical components 54, 62) connected, directly or indirectly, to primary circuit board 26 and/or secondary circuit board(s) 28. A first power bus 100 and a second power bus 102 may, for example and without limitation, include a 12 V bus and a 5 V bus, respectively. An electrical ground bus 106 may provide an electrical ground connection for primary circuit board 26 and/or secondary circuit board(s) 28. A communication bus 104 may include, for example and without limitation, a serial peripheral interface (SPI) bus.

In embodiments, primary circuit board may include a primary controller 40. Primary controller 40 may be configured to control one or more electrical components 54 of primary circuit board 26. Additionally or alternatively, primary controller 40 may be configured to control one or more electrical components 62 (which may include secondary controllers) that may be connected to secondary circuit board(s) 28. For example and without limitation, primary controller 40 may be configured to communicate with and/or control electrical components 62 connected to secondary circuit board(s) via communications bus 104.

In embodiments, a controller (e.g., primary controller 40) may include an electronic controller and/or include an electronic processor, such as a programmable microprocessor and/or microcontroller. In embodiments, a controller may include, for example, an application specific integrated circuit (ASIC). A controller may include a central processing unit (CPU), a memory, and/or an input/output (I/O) interface. A controller may be configured to perform various functions, including those described in greater detail herein, with appropriate programming instructions and/or code embodied in software, hardware, and/or other medium. In embodiments, a controller may include a plurality of controllers. In embodiments, a controller may be connected to a display, such as a touchscreen display.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

It is intended that all matter contained in the above description or shown in the accompanying drawings shall be interpreted as illustrative only and not limiting. Changes in detail or structure may be made without departing from the present disclosure.

What is claimed is:

1. An electrical unit, comprising:
   a housing member;
   a cover configured to at least partially cover the housing member;
   a primary circuit board fixed with the housing member, the primary circuit board including a plurality of connection sections and a primary controller; and
   two or more secondary circuit boards, each secondary circuit board including electrical components configured to perform a respective vehicle function of a plurality of vehicle functions, wherein the electrical components of each secondary circuit board include a respective secondary controller;
   wherein each secondary circuit board is connected to a respective connection section of the plurality of connection sections via a respective interconnection header;
   wherein each secondary circuit board includes a main surface and a connector header extending in a perpendicular direction from the main surface such that the connector header is configured to connect to a respective connector portion of the cover in the perpendicular direction;
   wherein the primary controller is configured to control, at least in part, operation of each secondary controller.

2. The electrical unit of claim 1, wherein the plurality of vehicle functions includes one or more of heated seats, PWM-controller lighting, windshield wipers, passive entry, passive start, power windows, and door locking.

3. The electrical unit of claim 1, wherein each of the two or more secondary circuit boards is configured to communicate with the primary controller of the primary circuit board via a serial peripheral interface bus.

4. The electrical unit of claim 1, wherein at least one secondary circuit board of the two or more secondary circuit boards is connected to two pairs of connection sections of the plurality of connection sections.

5. The electrical unit of claim 1, wherein an electrical component of the electrical components is connected to an underside of a first secondary circuit board of the two or more secondary circuit boards such that the electrical component is disposed at least partially between the first secondary circuit board and the primary circuit board.

6. The electrical unit of claim 1, wherein at least one secondary circuit board of the two or more secondary circuit boards is configured for a direct connection with a vehicle wiring harness.

7. The electrical unit of claim 1, wherein at least one secondary circuit board of the two or more secondary circuit boards is connected to a first power bus, a second power bus, a communication bus, and a ground bus.

8. The electrical unit of claim 1, wherein the plurality of connection sections includes at least four pairs of connection sections.

9. The electrical unit of claim 1, wherein the two or more secondary circuit boards includes at least two secondary circuit boards of different configurations.

10. The electrical unit of claim 1, wherein the housing member includes a support column for at least one secondary circuit board of the two or more secondary circuit boards, each support column extending through the primary circuit board to support an underside of the at least one secondary circuit board of the two or more secondary circuit boards.

11. The electrical unit of claim 10, wherein each support column is aligned with the connector header of the respective secondary circuit board.

12. The electrical unit of claim 1, wherein each secondary circuit board of the two or more secondary circuit boards are disposed substantially at a common height relative to the primary circuit board.

13. The electrical unit of claim 1, wherein at least one secondary circuit board of the two or more secondary circuit boards is soldered to the respective interconnection header, and the respective interconnection header is soldered to the primary circuit board.

14. The electrical unit of claim 1, wherein at least one interconnection header includes at least ten electrical terminals.

15. The electrical unit of claim 1, wherein the two or more secondary circuit boards includes at least two secondary circuit boards having a common configuration.

16. An electrical unit, comprising:
   a housing member;
   a cover configured to at least partially cover the housing member;
   a primary circuit board fixed to the housing member and including a plurality of connection sections and a primary controller;
   a plurality of secondary circuit boards, each secondary circuit board including electrical components configured to perform a respective vehicle function of a plurality of vehicle functions, wherein the electrical components of each secondary circuit board include a respective secondary controller;
   wherein the plurality of connection sections are configured to connect the plurality secondary circuit boards to the primary circuit board via interconnection headers;

each secondary circuit board includes a main surface and a connector header extending in a perpendicular direction from the main surface such that the connector header is configured to connect to a respective connector portion of the cover in the perpendicular direction;

the primary controller is configured to control, at least in part, operation of each secondary controller;

the housing member includes a support column for at least one secondary circuit board of the plurality of secondary circuit boards;

the support column extends through the primary circuit board to support an underside of the at least one secondary circuit board; and each support column is aligned with the connector header of the respective secondary circuit board.

17. The electrical unit of claim 16, wherein at least one secondary circuit board of the plurality of secondary circuit boards is connected to a first power bus, a second power bus, a communication bus, and a ground bus.

18. The electrical unit of claim 16, wherein the plurality of connection sections includes at least four pairs of connection sections.

19. The electrical unit of claim 16, wherein the plurality of secondary circuit boards are disposed substantially at a common height relative to the primary circuit board.

20. The electrical unit of claim 16, wherein the plurality of secondary circuit boards includes at least two secondary circuit boards having a common configuration.

* * * * *